US012449617B2

(12) United States Patent
Zhang et al.

(10) Patent No.: US 12,449,617 B2
(45) Date of Patent: Oct. 21, 2025

(54) OPTICAL MODULE

(71) Applicant: HISENSE BROADBAND MULTIMEDIA TECHNOLOGIES CO., LTD., Shandong (CN)

(72) Inventors: Jiaao Zhang, Shandong (CN); Xinnan Wang, Shandong (CN); Jianwei Mu, Shandong (CN)

(73) Assignee: HISENSE BROADBAND MULTIMEDIA TECHNOLOGIES CO., LTD., Shandong (CN)

( * ) Notice: Subject to any disclaimer, the term of this patent is extended or adjusted under 35 U.S.C. 154(b) by 325 days.

(21) Appl. No.: 18/331,933

(22) Filed: Jun. 9, 2023

(65) Prior Publication Data

US 2023/0314741 A1    Oct. 5, 2023

Related U.S. Application Data

(63) Continuation of application No. PCT/CN2021/134678, filed on Dec. 1, 2021.

(30) Foreign Application Priority Data

Dec. 14, 2020  (CN) .......................... 202011466259.7
Dec. 14, 2020  (CN) .......................... 202022993019.4

(51) Int. Cl.
  *H04B 10/00*  (2013.01)
  *G02B 6/42*   (2006.01)
  *H05K 1/18*   (2006.01)

(52) U.S. Cl.
  CPC ......... *G02B 6/4281* (2013.01); *G02B 6/4284* (2013.01); *H05K 1/189* (2013.01); *H05K 2201/10121* (2013.01)

(58) Field of Classification Search
  CPC .. G02B 6/4281; G02B 6/4284; G02B 6/4246; G02B 6/4261; G02B 6/4292; H05K 1/189; H05K 2201/10121; H05K 1/147
  See application file for complete search history.

(56) References Cited

U.S. PATENT DOCUMENTS 7,153,043 B1    12/2006  Zhang et al.
2005/0265671 A1* 12/2005  Ono ..................... G02B 6/4231
                                                    385/88

(Continued)

FOREIGN PATENT DOCUMENTS

CN    103105651 A    5/2013
CN    104503044 A    4/2015

(Continued)

OTHER PUBLICATIONS

International Search Report and Written Opinion mailed Jun. 23, 2022, in corresponding International Application No. PCT/CN2021/134678 (including English translation).

(Continued)

*Primary Examiner* — Agustin Bello
(74) *Attorney, Agent, or Firm* — Harness, Dickey & Pierce, P.L.C.

(57) ABSTRACT

An optical module including: a first circuit board; a second circuit board; a light emitting component, arranged above the first circuit board and electrically connected to a first and a second flexible circuit board and a second flexible circuit board; a light receiving component arranged below the light emitting component and being electrically connected to a third flexible circuit board; the first flexible circuit, with two ends thereof being electrically connected to the light emitting component and a non-high-speed signal pad provided on the second circuit board, respectively; the second flexible circuit board, with two ends thereof being electrically connected to the light emitting component and a first high-speed (Continued)

signal pad provided on the first circuit board, respectively; the third flexible circuit board, with two ends thereof being electrically connected to the light receiving component and a second high-speed signal pad provided on the first circuit board, respectively.

20 Claims, 6 Drawing Sheets

(56) References Cited

U.S. PATENT DOCUMENTS

| | | | |
|---|---|---|---|
| 2006/0024005 A1* | 2/2006 | Ice | G02B 6/4245 385/92 |
| 2006/0098984 A1* | 5/2006 | Sakai | H05K 1/148 398/138 |
| 2007/0051877 A1* | 3/2007 | Sakai | H05K 1/0243 250/214 R |
| 2008/0031576 A1* | 2/2008 | Hudgins | H04B 10/075 385/92 |
| 2016/0291271 A1 | 10/2016 | Mizobuchi et al. | |

FOREIGN PATENT DOCUMENTS

| | | |
|---|---|---|
| CN | 106371176 A | 2/2017 |
| CN | 107623249 A | 1/2018 |
| CN | 109387909 A | 2/2019 |
| CN | 210093667 U | 2/2020 |
| CN | 213659029 U | 7/2021 |
| JP | 2007123739 A | 5/2007 |

OTHER PUBLICATIONS

Office Action mailed Oct. 9, 2022, in corresponding Chinese Application No. 202011466259.7 (with English translation).

* cited by examiner

OPTICAL MODULE

This application is a continuation application of PCT/CN2021/134678, filed on Dec. 1, 2021 which claims priority to Chinese Application No. 202011466259.7, filed on Dec. 14, 2020, and Chinese Application No. 202022993019.4, filed on Dec. 14, 2020, which are incorporated herein by reference in their entireties.

FIELD OF THE INVENTION

The present disclosure relates to the field of optical communication technologies, and in particular, to an optical module.

BACKGROUND OF THE INVENTION

Optical communication technology is employed in new business and applications such as cloud computing, mobile internet, and video, etc. In optical communication, an optical module is an equipment for achieving mutual conversion between optical signals and electric signals, and is one of the key devices in an optical communication equipment. Optical modules are mostly used for optical-electro and electro-optical conversion. In an optical module, a transmitting end is designed to convert electrical signals into optical signals and transmit them through optical fibers, and a receiving end is designed to convert received optical signals into electrical signals.

SUMMARY OF THE INVENTION

The present disclosure provides an optical module, including: a first circuit board, wherein golden fingers are provided on surfaces at one end of the first circuit board, a first high-speed signal pad is provided on an upper surface at the other end of the first circuit board, and a second high-speed signal pad is provided on a lower surface at said other end of the first circuit board; a second circuit board, which is arranged above the first circuit board and is electrically connected to the first circuit board, with a non-high-speed signal pad being provided on a surface of the second circuit board; a light emitting component, which is arranged above the first circuit board and electrically connected to a first flexible circuit board and a second flexible circuit board respectively, and a tip of the light emitting component is provided with a pin connector; a light receiving component, wherein the light receiving component and the light emitting component are arranged in a stacked way, one above the other, with the light receiving component being arranged below the light emitting component and being electrically connected to a third flexible circuit board; the first flexible circuit board electrically connected to an upper surface of the pin connector, with one end of the first flexible circuit board being electrically connected to the light emitting component, and the other end of the first flexible circuit board being electrically connected to the non-high-speed signal pad; the second flexible circuit board electrically connected to a lower surface of the pin connector, with one end of the second flexible circuit board being electrically connected to the light emitting component, and the other end of the second flexible circuit board being electrically connected to the first high-speed signal pad; and the third flexible circuit board, with one end of the third flexible circuit board being electrically connected to the light receiving component, and the other end of the third flexible circuit board being electrically connected to the second high-speed signal pad.

BRIEF DESCRIPTION OF THE DRAWINGS

To more clearly describe the technical solutions of the present disclosure, the accompanying drawings to be used in the embodiments will be described briefly below. Apparently, other accompanying drawings may also be derived, without an inventive effort, by one of ordinary skills in the art from these accompanying drawings.

DETAILED DESCRIPTION OF THE EMBODIMENTS

Figure 1:
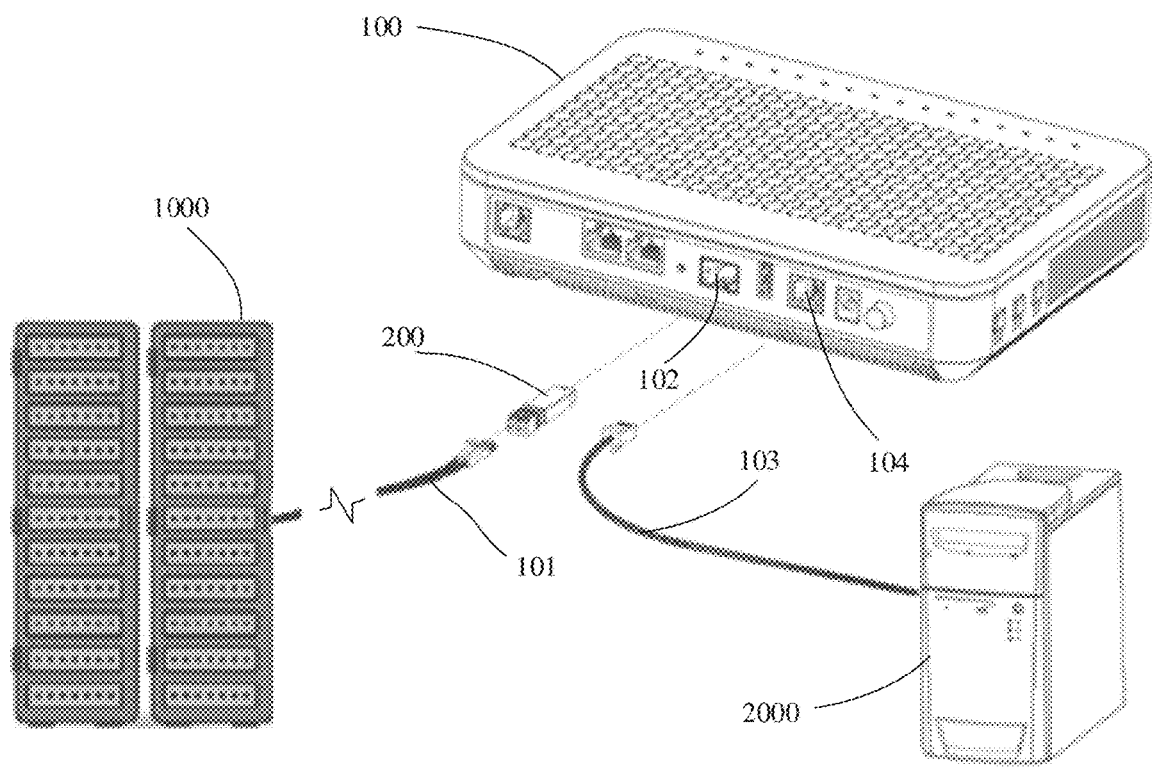
FIG. 1 is a part of a structural diagram of an optical communication system provided according to some embodiments of the present disclosure.

Hereinafter, technical solutions in some embodiments of the present disclosure will be described clearly and completely with reference to the accompanying drawings. Obviously, the described embodiments merely show some but not all embodiments of the present disclosure. All other embodiments obtained by a person of ordinary skill in the art based on the embodiments of the present disclosure shall fall within the protection scope of the present disclosure.

Throughout the specification and claims, unless the context requires otherwise, the term "comprise" and other forms such as the third person singular "comprises" and the present participle "comprising" are interpreted as the meaning of openness and inclusion, that is, "including, but not limited to". In the description of the specification, the terms "one embodiment", "some embodiments", "exemplary embodiment(s)", "an example", "a specific example" or "some examples" etc. are intended to indicate that specific features, structures, materials or properties related to the embodiment(s) or example(s) are comprised in at least one embodiment or example of the present disclosure. Schematic representations of the above terms do not necessarily refer to the same embodiment(s) or example(s). In addition, the specific features, structures, materials or characteristics described may be comprised in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, features defined with "first" and "second" may explicitly or implicitly comprise one or more of the features. In the description of the embodiments of the present disclosure, "plurality" means two or more unless otherwise specified.

In describing some embodiments, the expressions "coupled" and "connected" and their derivatives may be used. For example, the term "connected" may be used in the description of some embodiments to indicate that two or more parts are in direct physical or electrical contact with each other. As another example, the term "coupled" may be used in the description of some embodiments to indicate that two or more parts are in direct physical or electrical contact. However, the terms "coupled" or "communicatively coupled" may also mean that two or more parts are not in direct contact with each other, but still cooperate or interact with each other. The embodiments disclosed herein are not necessarily limited by the contents herein.

"At least one of A, B and C" has the same meaning as "at least one of A, B or C" and both include the following combinations of A, B and C: A only, B only, C only, a combination of A and B, a combination of A and C, a combination of B and C, and a combination of A, B and C.

"A and/or B" includes the following three combinations: A only, B only, and a combination of A and B.

The use of "suitable for" or "configured to" herein means open and inclusive language that does not exclude devices that are suitable for or configured to perform additional tasks or steps.

As used herein, "about", "substantially" or "approximately" includes the mentioned value as well as the average within an acceptable deviation range of the specified value, wherein the acceptable deviation range is as determined by one of ordinary skill in the art taking into account the measurement in question and the errors associated with the measurement of a particular quantity (i.e., limitations of the measurement system).

In optical communication technology, in order to establish information transmission between information processing devices, it is necessary to load information onto light and realize information transmission via light transmission. Here, the light loaded with information is exactly the optical signal. When optical signals are transmitted in information transmission devices, a loss of optical power may be reduced, so a high-speed, long-distance, and low-cost information transmission can be realized. Signals that can be recognized and processed by an information processing device are electrical signals. Conventional information processing devices may include optical network terminals (Optical Network Unit, ONU), gateways, routers, switches, mobile phones, computers, servers, tablet computers, TVs, etc. Information transmission devices usually include optical fibers, optical waveguides, etc.

An optical module can realize mutual conversion of optical signals and electrical signals between an information processing device and an information transmission device. For example, at least one of an optical signal input port or an optical signal output port of the optical module is connected to an optical fiber, and at least one of an electrical signal input port or an electrical signal output port of the optical module is connected to an optical network terminal. A first optical signal from the optical fiber is transmitted to the optical module, and is converted by the optical module into a first electrical signal; said first electrical signal is transmitted to the optical network terminal. A second electrical signal from the optical network terminal is transmitted to the optical module, and is converted by the optical module into a second optical signal; said second optical signal is transmitted to the optical fiber. Since information can be transmitted between multiple information processing devices via electrical signals, only at least one of the multiple information processing devices is needed to be directly connected to the optical module, instead of all the information processing devices being directly connected to the optical module. Here, the information processing device directly connected to the optical module is referred to as an host computer of the optical module. In addition, the optical signal input port or the optical signal output port of the optical module may be referred to as an optical port, and the electrical signal input port or electrical signal output port of the optical module may be referred to as an electrical port.

FIG. 1 is a part of a structural diagram of an optical communication system provided according to some embodiments of the present disclosure. As shown in FIG. 1, the optical communication system mainly includes a remote information processing device 1000, a local information processing device 2000, a host computer 100, an optical module 200, an optical fiber 101 and a network cable 103. In some embodiments, the remote information processing device may also be referred to as a remote server, and the host computer may also be referred to as an optical network terminal.

One end of the optical fiber 101 extends toward the remote information processing device 1000, and the other end of the optical fiber 101 is connected to the optical module 200 through the optical port of the optical module 200. The optical signal can be totally reflected in the optical fiber 101, and the optical signal may propagate in the direction of total reflection substantially without power loss. The optical signal undergoes many times of total reflections in the optical fiber 101, so that the optical signal from the optical module 200 may be transmitted to the optical module 200, or the optical signal from the optical module 200 may be transmitted to the remote information processing device 1000, so as to realize an information transmission of long-distance and low power loss.

The optical communication system may include one or more optical fibers 101, and the optical fibers 101 are detachably or fixedly connected to the optical module 200. The host computer 100 is configured to provide data signals to the optical module 200, or receive data signals from the optical module 200, or monitor or control an operation of the optical module 200.

The host computer 100 includes a substantially rectangular parallelepiped housing, and an optical module interface 102 provided on the housing. The optical module interface 102 is configured to access the optical module 200, so that a uni-directional or bi-directional electrical connection between the optical network terminal 100 and the optical module 200 is established.

The host computer 100 also includes an external electrical interface, which may access an electrical signal network. For example, the external electrical interface may include a Universal Serial Bus (USB) interface or a network cable interface 104; the network cable interface 104 is connected to the network cable 103, so that a uni-directional or bi-directional electrical connection is established between the host computer 100 and the network cable 103. One end of the network cable 103 is connected to the local information processing device 2000, and the other end of the network cable 103 is connected to the host computer 100, so as to establish an electrical connection between the local information processing device 2000 and the host computer 100 via the network cable 103. For example, a third electrical signal sent by the local information processing device 2000 is transmitted to the host computer 100 through the network cable 103, and the host computer 100 generates a second electrical signal according to the third electrical signal which is then transmitted to the optical module 200; the optical module 200 converts the second electrical signal into a second optical signal, and outputs the second optical signal to the optical fiber 101; the second optical signal is transmitted to the remote information processing device 1000 via the optical fiber 101. For example, a first optical signal from the remote information processing device 1000 propagates through the optical fiber 101, is transmitted via the optical fiber 101 to the optical module 200; the optical module 200 converts the first optical signal into a first electrical signal, and transmits the first electrical signal to the host computer 100, which generates a fourth electrical signal according to the first electrical signal and transmits the fourth electrical signal to the local information processing device 2000. It should be noted that the optical module is an equipment to realize mutual conversion between optical signals and electrical signals. During above conversion of the optical signals and electrical signals, the information carried thereby is not changed, rather, the way that the information is encoded/decoded can be changed.

In addition to the optical network terminal, the host computer 100 may also include an optical line terminal (Optical Line Terminal, OLT), an optical network device (Optical Network Terminal, ONT), or a data center server, etc.

Figure 2:
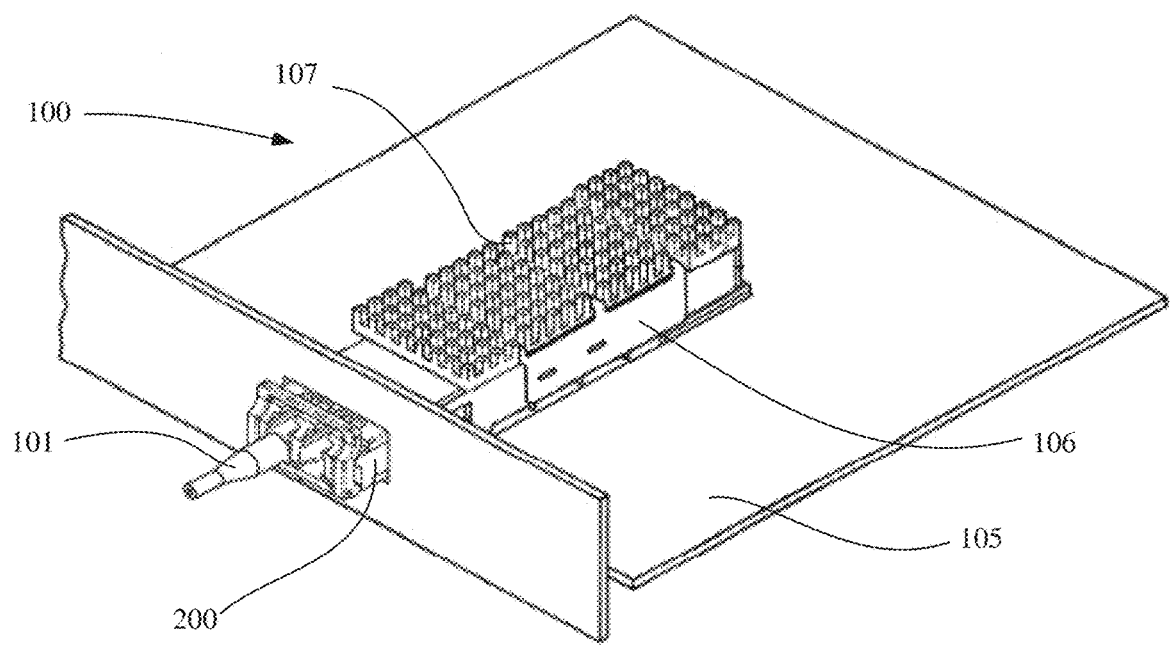
FIG. 2 is a partial structural diagram of a host computer provided according to some embodiments of the present disclosure.

FIG. 2 is a partial structural diagram of a host computer provided according to some embodiments of the present disclosure. In order to clearly show a connection relationship between the optical module 200 and the host computer 100, FIG. 2 merely illustrates a partial structure of the host computer 100 that is interrelated to the optical module 200. As shown in FIG. 2, the host computer 100 also includes a PCB 105 arranged in the housing, a cage 106 arranged on the surface of the PCB 105, a radiator 107 arranged on the cage 106, and an electrical connector arranged inside the cage 106. The electrical connector is configured to access an electrical port of the optical module 200; the radiator 107 has a protruding structure such as fins to increase a heat dissipation area.

The optical module 200 is inserted into the cage 106 of the host computer 100, and is fixed by the cage 106. The heat generated by the optical module 200 is conducted to the cage 106 and then diffused through the radiator 107. When the optical module 200 is inserted into the cage 106, the electrical port of the optical module 200 is connected to the electrical connector inside the cage 106, so that a bi-directional electrical connection is established between the optical module 200 and the host computer 100. In addition, the optical port of the optical module 200 is connected with the optical fiber 101, so that a bi-directional optical connection is established between the optical module 200 and the optical fiber 101.

Figure 3:
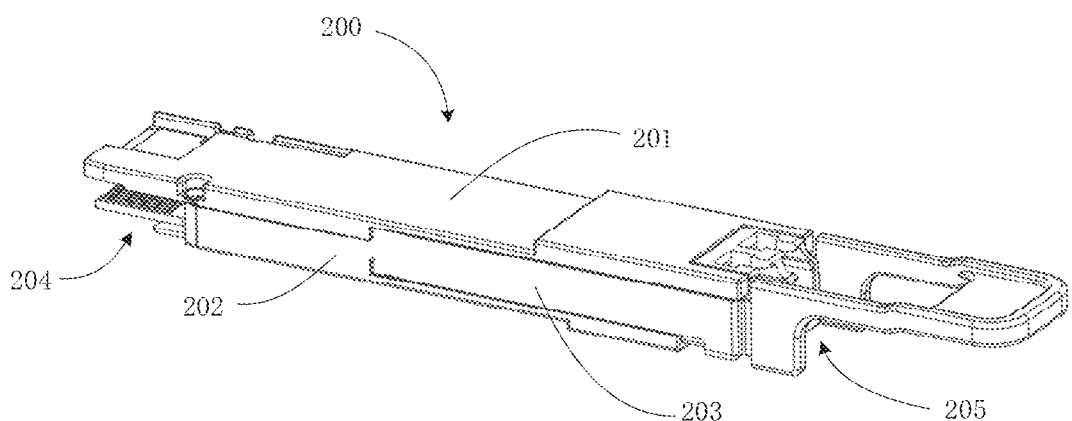
FIG. 3 is a schematic structural diagram of an optical module provided according to some embodiments of the present disclosure.
Figure 4:
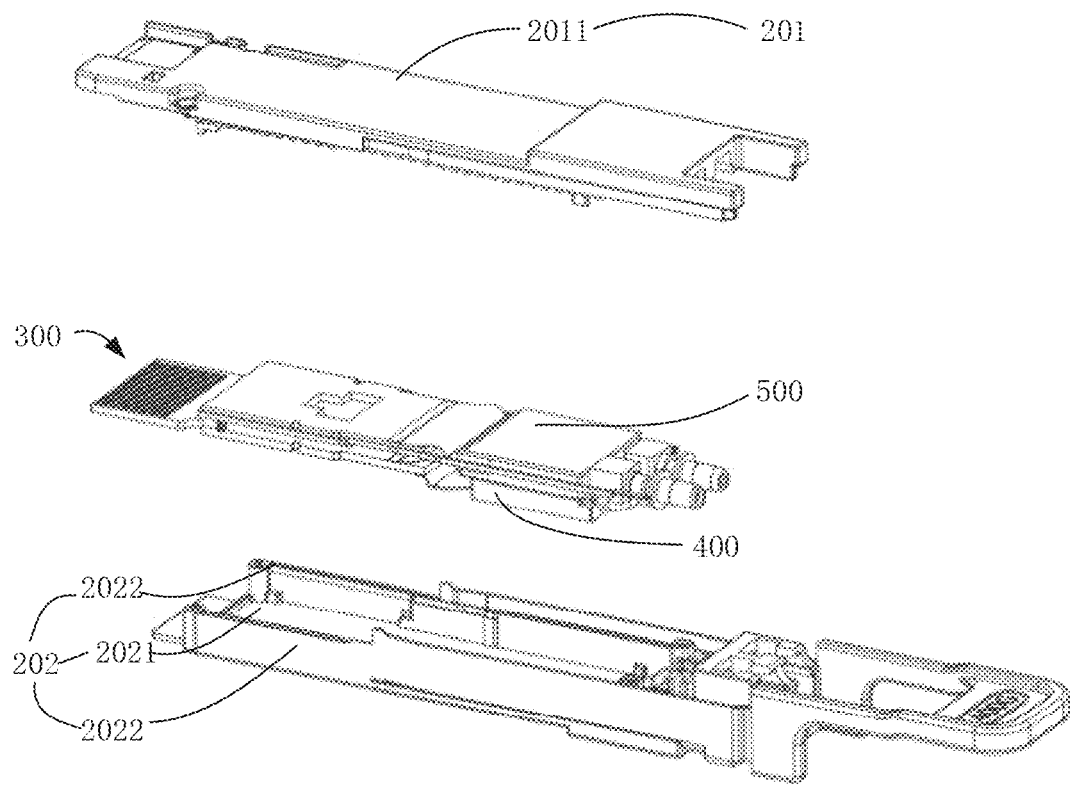
FIG. 4 is an exploded view of an optical module provided according to some embodiments of the present disclosure.

FIG. 3 is a schematic structural diagram of an optical module provided according to some embodiments of the present disclosure, and FIG. 4 is an exploded view of an optical module provided according to some embodiments of the present disclosure. As shown in FIG. 3 and FIG. 4, the optical module 200 includes a housing, a circuit board 300 arranged in the housing, a light receiving component 400 and a light emitting component 500.

The housing includes an upper housing 201 and a lower housing 202. The upper housing 201 is covered on the lower housing 202 to form the housing with two openings 204 and 205; the outer contour of the housing is generally in a cuboid shape.

In some embodiments, the lower housing 202 includes a bottom plate 2021 and two lower side plates 2022 respective provided on two sides of the bottom plate 2021 perpendicularly to the bottom plate 2021. The upper housing 201 includes a cover plate 2011. The cover plate 2011 is covered on the two lower side plates 2022 of lower housing 202 to form the housing.

In some embodiments, the lower housing 202 includes a bottom plate 2021 and two lower side plates 2022 respective provided on two sides of the bottom plate 2021 perpendicularly to the bottom plate 2021. The upper housing 201 includes a cover plate 2011 and two upper side plates respective provided on two sides of the cover plate 2011 perpendicularly to the bottom plate 2021. The two upper side plate are respectively engaged with the two lower side plate 2022, so that the upper housing 201 is covered on the lower housing 202.

A virtual line connecting the two openings 204 and 205 may extend in a direction parallel to a length direction of the optical module 200, or may extend in a direction not parallel to the length direction of the optical module 200. For example, the opening 204 is provided at one end of the optical module 200 (the right end in FIG. 3), and the opening 205 is provided at the other end of the optical module 200 (the left end in FIG. 3). Alternatively, the opening 204 is provided at an end of the optical module 200, and the opening 205 is provided at a side of the optical module 200. The opening 204 forms an electrical port, and the golden finger 303 of the circuit board 300 may extend outwardly from the opening 204 and be inserted into an electrical connector of the host computer 100. The opening 205 forms an optical port and is configured to allow accessing of the external optical fiber 101, so that the optical fiber 101 may be connected to the light receiving component 400 and the optical transmission parts 500 in the optical module 200.

The way in which the upper housing 201 cooperates with the lower housing 202 to form an assembly helps to arrange devices such as the circuit board 300, the light receiving component 400, and the light emitting component 500 into the housing. The upper housing 201 and the lower housing 202 form an outermost packaging protective enclosure of the optical module. In addition, during assembly of devices such as the circuit board 300, the light receiving component 400, and the light emitting component 500, an arrangement of positioning components, heat dissipation components, and electromagnetic shielding components for these devices may be facilitated, which is beneficial to automatic implementation and production.

In some embodiments, the upper housing 201 and the lower housing 202 are generally made of metal materials, which is beneficial to realize electromagnetic shielding and heat dissipation.

In some embodiments, the optical module 200 further includes an unlocking part 203 arranged on the outer wall of its housing that is configured to realize a fixed connection between the optical module 200 and the host computer or to release the fixed connection between the optical module 200 and the host computer.

By way of example, the unlocking part 203 is arranged on the outer walls of the two lower side plates 2022 of the lower housing 202, and includes a snap component matching with the cage 106 of the host computer 100. When the optical module 200 is inserted into the cage 106, the optical module 200 is fixed within the cage 106 by the snap component of the unlocking part 203; when the unlocking part 203 is pulled, the snap component of the unlocking part 203 moves therewith, such that the connection relationship between the snap component and the host computer is in turn changed in order to release the snapping relationship between the optical module 200 and the host computer; by this, the optical module 200 can be pulled out of the cage 106.

The circuit board 300 is provided with circuit tracings, electronic components and chips. The electronic components and chips are connected according to circuit design via circuit tracings, so as to realize functions such as power supply, electrical signal transmission and grounding. The electronic components may include, for example, capacitors, resistors, triodes, and Metal-Oxide-Semiconductor Field-Effect Transistor (MOSFET). The chip may include, for example, a Microcontroller Unit (MCU), a limiting amplifier, a Clock and Data Recovery (CDR), a power management chip, and a Digital Signal Processing (DSP) chip.

The circuit board 300 is generally a rigid circuit board. Due to its relatively hard material, the rigid circuit board can also realize a carrying function, for example to carry chips stably; the rigid circuit board can also be inserted into the electrical connector in the cage 106 of the host computer 100.

The circuit board 300 is also provided with golden fingers 303 formed on an end surface thereof, and the golden fingers 303 are formed of a plurality of pins independent of each other. The circuit board 300 is inserted into the cage 106, with the golden fingers 303 being conductively connected with the electrical connector in the cage 106. The golden fingers 303 may be only provided on one surface of the circuit board 300 (such as the upper surface shown in FIG. 4), or may also be arranged on both the upper surface and the lower surface of the circuit board 300, so as to adapt to occasions in which a large number of pins are required. The golden fingers 303 are configured to establish an electrical connection with the host computer to realize power supply, grounding, I2C signal transmission, data signal transmission, etc. Of course, flexible circuit boards may also be used in some optical modules. Flexible circuit boards are generally used in cooperation with the rigid circuit boards as a supplement to rigid circuit boards.

Figure 5:
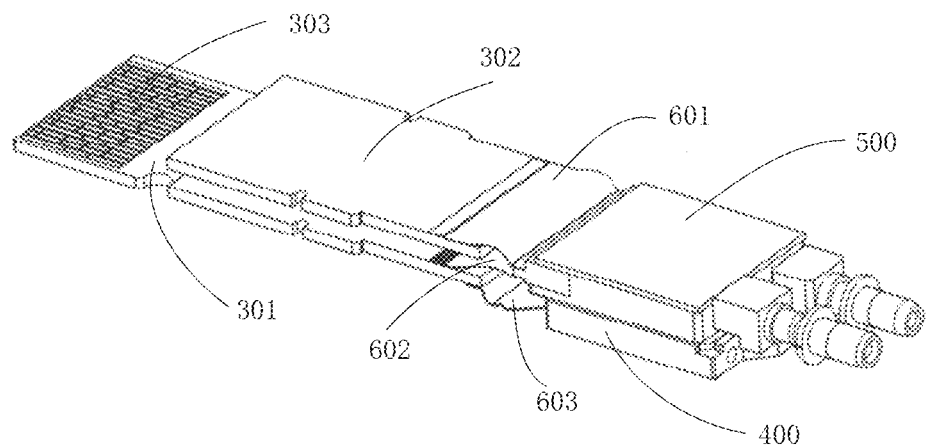
FIG. 5 is a schematic structural diagram of a part of an optical module provided according to some embodiments of the present disclosure.
Figure 6:
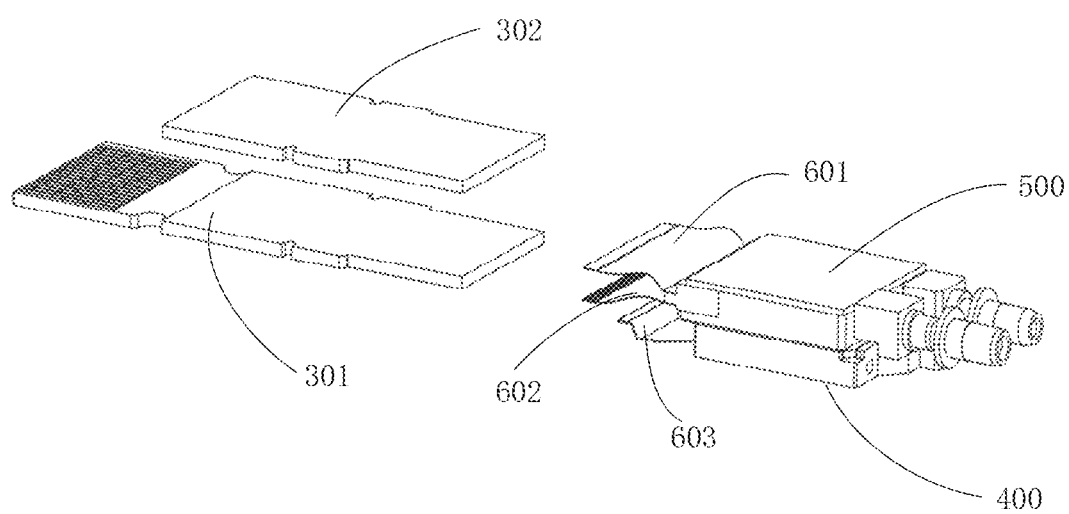
FIG. 6 is a schematic exploded structural diagram of a part of an optical module according to some embodiments of the present disclosure.

FIG. 5 is a schematic structural diagram of a part of an optical module provided according to some embodiments of the present disclosure, and FIG. 6 is a schematic exploded structural diagram of a part of an optical module provided according to some embodiments of the present disclosure. As shown in FIG. 5 and FIG. 6, in the optical module according to some embodiments, the circuit board includes a first circuit board 301 and a second circuit board 302, an electrical connection is established between the first circuit board 301 and the second circuit board 302, and the second circuit board 302 is powered by the first circuit board 301.

Golden fingers 303 are provided at the end of the first circuit board 301; the golden fingers 303 are inserted into the host computer outside the optical module to obtain power supply and signals required for an operation of the optical module from the host computer. The other end of the first circuit board 301 is connected to the flexible circuit board.

The second circuit board 302 is arranged to be stacked above/over the top surface of the first circuit board 301; this kind of stacking arrangement takes advantages of a space in the height direction inside the housing of the optical module, such that an area for tracing layout may be increased by addition of the second circuit board 302, which is beneficial for disposing more electrical devices in the optical module as well as providing more design space for distribution of the electrical devices. The second circuit board 302 is electrically connected to the first circuit board 301, and the first circuit board 301 supplies power and provides electrical signals to the second circuit board 302. It is noted that the signals provided by the first circuit board 301 to the second circuit board 302 do not include high-speed signals, for example, the signals provided by the first circuit board 301 to the second circuit board 302 are non-high-speed signals. In some embodiments of the present disclosure, the electrical connection may be realized by a pin-type electrical connector between the first circuit board 301 and the second circuit board 302, or a plug-in electrical connector may also be used. One end of the second circuit board 302 is connected to the flexible circuit board.

In some embodiments of the present disclosure, the light receiving component 400 and the light emitting component 500 are arranged in a stacked way, i.e., one on the top of the other; the light receiving component 400 and the light emitting component 500 are connected to flexible circuit boards respectively, and are connected to the surfaces of the first circuit board 301 and the second circuit board respectively. The flexible circuit boards include a first flexible circuit board 601, a second flexible circuit board 602 and a third flexible circuit board 603.

The light receiving component 400 is provided with an internal cavity for accommodating a light receiving chip and receiving optical elements therein; light received by the receiving optical elements is transmitted to the light receiving chip, and the light receiving chip converts the optical signal into an electrical signal which is a high-speed signal; the high-speed signal is transmitted to the first circuit board 301 through the third flexible circuit board 603, and then transmitted into the host computer via the first circuit board 301.

In some embodiments, the third flexible circuit board 603 is disposed on a side close to the first circuit board 301, and is configured to transmit the electrical signals generated by the light receiving component 400. Exemplarily, the electrical signal generated by the light receiving component 400 is transmitted to the surface of the first circuit board 301 through the third flexible circuit board 603, and then transmitted into the host computer via the first circuit board 301. Since the third flexible circuit board 603 is disposed close to the first circuit board 301, the electrical signal generated by the light receiving component 400 may be transmitted to the host computer via the electrical connection between the third flexible circuit board 603 and the first circuit board 301, thereby reducing a loss of electrical signals during transmission.

The light emitting component 500 is provided with an internal cavity for accommodating a light emitting chip and emitting optical elements, and the light emitted by the light emitting chip is transmitted to the external optical fiber of the optical module via the emitting optical element; high-speed signals from the host computer are fed into the first circuit board 301, which in turn transmits the high-speed signals into the light emitting component 500 via the second flexible circuit board 602; the light emitting chip then converts the high-speed signals into optical signals.

In some embodiments, the second flexible circuit board 602 is configured to transmit high-speed signals required by the light emitting component 500. Exemplarily, high-speed signals from the host computer are transmitted to the first circuit board 301, and the first circuit board 301 transmits the high-speed signals into the light emitting component 500 via the second flexible circuit board 602.

In some embodiments, the first flexible circuit board 601 is configured to transmit non-high-speed signals required by the light emitting component 500. Exemplarily, non-high-speed signals from the host computer are transmitted to the surface of the first circuit board 301, and the first circuit board 301 transmits the non-high-speed signals into the light emitting component 500 via the second circuit board 302 and the first flexible circuit board 601.

In some embodiments, non-high-speed signals and high-speed signals required by the light emitting component 500 are transmitted via the first flexible circuit board 601 and the second flexible circuit board 602 respectively; by this, different types of signals are transmitted via different flexible circuit boards, so that it is possible to reduce intertwining of signal tracings, crosstalk between signals, etc., thereby improving signal transmission performance. At the same time, since the high-speed signals required by the light emitting component 500 are directly transmitted by means of the electrical connection between the first circuit board 301 and the second flexible circuit board 602 without an indirect transmission between the first circuit board 301 and the second circuit board 302, the transmission path of the high-speed signals can be optimized, thereby improving the transmission performance of high-speed signals.

The high-speed signals mainly refer to high-velocity signals transmitted between the first circuit board 301 and the second flexible circuit board 602, and between the first circuit board 301 and the third flexible circuit board 603; on the first circuit board 301, high-speed signals may be processed by multiple electrical devices, and the specific forms of high-speed signals may vary.

In some embodiments, one end of the first flexible circuit board 601 is connected to the light emitting component 500, and the other end of the first flexible circuit board 601 is connected to the second circuit board 302. Exemplarily, the other end of the first flexible circuit board 601 may be connected to the upper surface of the second circuit board 302, or may be connected to the lower surface of the second circuit board 302.

One end of the second flexible circuit board 602 is connected to the light emitting component 500, and the other end of the second flexible circuit board 602 is connected to the first circuit board 301.

One end of the third flexible circuit board 603 is connected to the light receiving component 400, and the other end of the third flexible circuit board 603 is connected to the first circuit board 301.

In some embodiments, the second flexible circuit board 602 is connected to the upper surface of the first circuit board 301, the third flexible circuit board 603 is connected to the lower surface of the first circuit board 301, and the light emitting component 500 is located above the light receiving component 400.

In some embodiments, the second flexible circuit board 602 and the third flexible circuit board 603 can also be both connected to the upper surface of the first circuit board 301; alternatively, the second flexible circuit board 602 and the third flexible circuit board 603 can also be both connected to the lower surface of the first circuit board 301. The connection mode between the second flexible circuit board 602 and the third flexible circuit board 603 and the first circuit board 301 are not limited by the embodiment of the present disclosure; as an example for exemplary illustration, in the following embodiments, the second flexible circuit board 602 is connected to the upper surface of the first circuit board 301 and the third flexible circuit board 603 is connected to the lower surface of the first circuit board 301.

Figure 7:
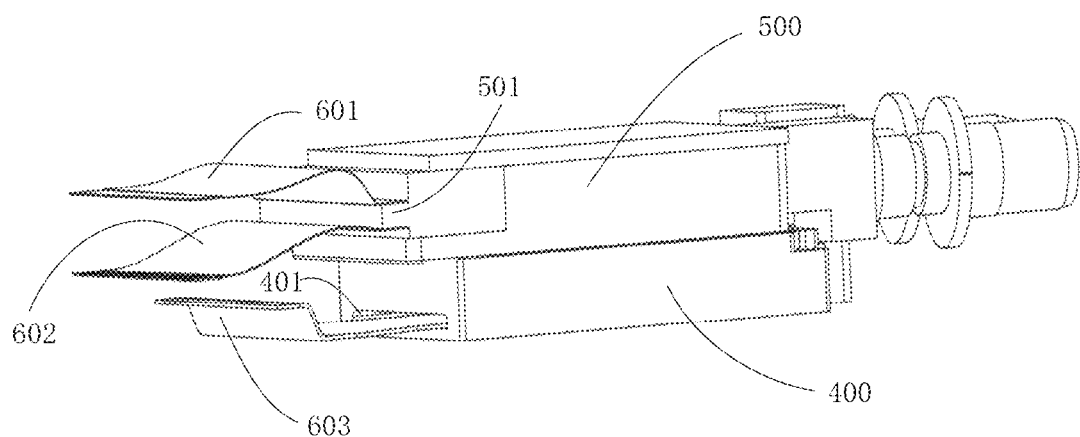
FIG. 7 is a schematic diagram of structures of a light emitting component and a light receiving component provided according to some embodiments of the present disclosure.

FIG. 7 is a schematic structural diagram of a light emitting component and a light receiving component provided according to some embodiments of the present disclosure. As shown in FIG. 7, one end of the light emitting component 500 is provided with a pin connector 501, the upper surface of which is connected to the first flexible circuit board 601, and the lower surface of which is connected to the second flexible circuit board 602. A notch is provided at the end of the light emitting component 500, with the pin connector 501 being inserted into the notch for realizing electrical connection between the inside and the outside of the light emitting component 500. Relatively large number of electrical pins are required within the light emitting component 500, so both the upper surface and the lower surface of the pin connector 501 are used at the same time for connecting the first flexible circuit board 601 to the upper surface of the pin connector 501, and connecting the second flexible circuit board 602 to the lower surface of the pin connector 501. An opening 401 is provided at one end of the light receiving component 400, and the third flexible circuit board 603 protrudes into the light receiving component 400 through the opening 401 for enabling electrical connection between the inside and the outside of the light receiving component 400.

In some embodiments, a notch is provided at the end of the light receiving component 400, with a pin connector being provided in the notch for enabling electrical connection between the inside and the outside of the light receiving component 400. The third flexible circuit board 603 is electrically connected to this pin connector. Exemplarily, the pin connector 501 in the light emitting component 500 may be referred to as a first pin connector, and the pin connector in the light receiving component 400 may be referred to as a second pin connector.

Figure 8:
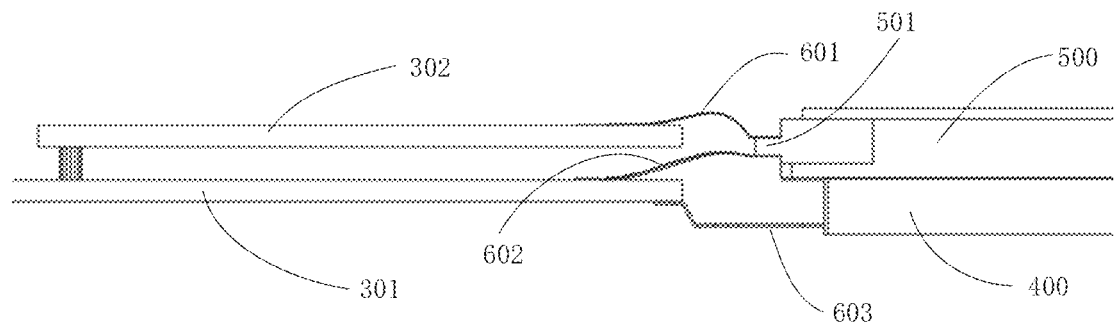
FIG. 8 is a side view of a partial structure of an optical module provided according to some embodiments of the present disclosure.
Figure 9:
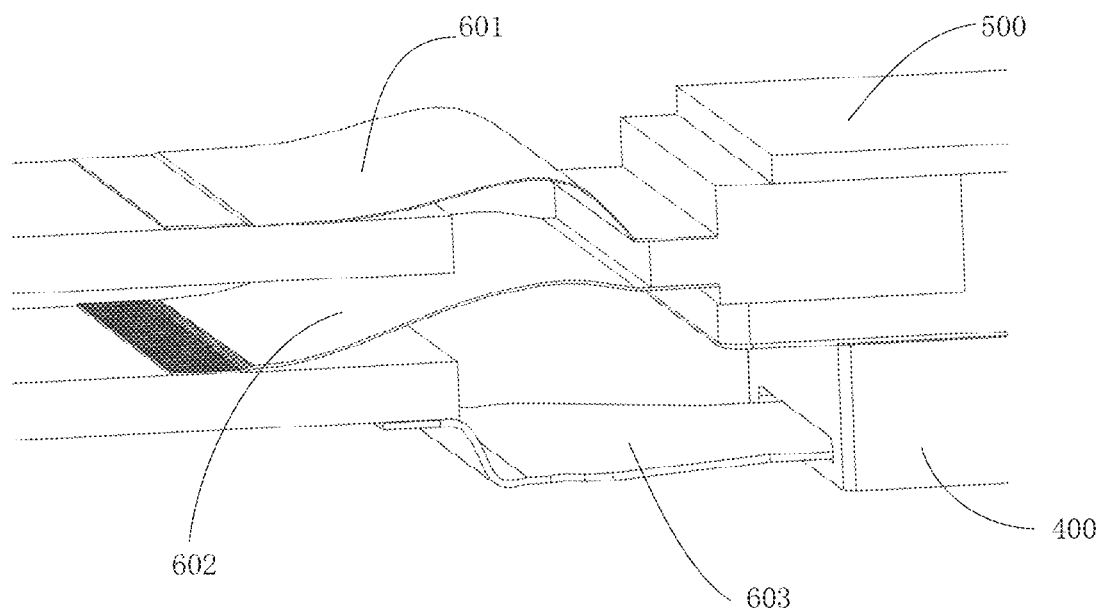
FIG. 9 is an enlarged view of a local structure of an optical module according to some embodiments of the present disclosure.

FIG. 8 is a side view of a partial structure of an optical module provided according to some embodiments of the present disclosure, and FIG. 9 is an enlarged view of a partial structure of an optical module provided according to some embodiments of the present disclosure. As shown in FIG. 8 and FIG. 9, since the second circuit board 302 and the first circuit board 301 are arranged in a stacked way, one above the other, the light emitting component 500 and the light receiving component 400 are arranged in a stacked way, one above the other, the first flexible circuit board 601, the second flexible circuit board 602 and the third flexible circuit board 603 which enable electrical connection between the circuit boards and the respective devices are also arranged in a stacked way, one above the other. The first flexible circuit board 601 is provided on the uppermost layer, the second flexible circuit board 602 is provided on the intermediate layer, and the third flexible circuit board 603 is loc provided on the lowermost layer.

The first circuit board 301 is directly electrically connected to the host computer outside the optical module, and is the component for a direct high-speed signal interaction between the optical module and the host computer; high-speed signals require a low-loss transmission mode.

High-speed signals need to be transmitted into the light emitting driver chip or light emitting chip within the light emitting component 500, and high-speed signals received and converted by the light receiving component need to be transmitted to the host computer outside the optical module. In view of the above requirement of the transmission mode for high-speed signals, the first circuit board 301 is employed to realize the high-speed signal electrical connection with the light emitting component and the light receiving component respectively; instead, the second circuit board 302 is not designed for realizing the high-speed signal electrical connection with the light emitting component and the light receiving component respectively.

Tracings for high-speed signal transmission are provided on the surfaces of the first circuit board 301; tracings for high-speed signals may be provided both on the upper surface and the lower surface of the first circuit board 301 respectively, in order to avoid transfer of high-speed signals in the first circuit board 301 by use of via-holes.

In some embodiments, the golden fingers include golden fingers for transmitting signals and golden fingers for receiving signals; when the second flexible circuit board 602 is connected to the upper surface of the first circuit board 301 and the third flexible circuit board 603 is connected to the lower surface of the first circuit board 301, the golden fingers for transmitting signals are arranged on the upper surface of the first circuit board 301, and the golden fingers for receiving signals are arranged on the lower surface of the first circuit board 301. Exemplarily, first high-speed signal pads run through the upper surface of the first circuit board 301, and establish an electrical connection with the golden fingers for transmitting signals on the upper surface of the first circuit board 301; second high-speed signal pads run through the lower surface of the first circuit board 301, and establish an electrical connection with the golden fingers for receiving signals on the lower surface of the first circuit board 301.

In some embodiments, when both the second flexible circuit board 602 and the third flexible circuit board 603 are connected to the upper surface of the first circuit board 301, both the golden fingers for transmitting signals and the golden fingers for receiving signals are arranged on the upper surface of the first circuit board 301. Exemplarily, first high-speed signal pads run through the upper surface of the first circuit board 301, and establish an electrical connection with the golden fingers for transmitting signals on the upper surface of the first circuit board 301; second high-speed signal pads run through the upper surface of the first circuit board 301, and establish an electrical connection with the golden fingers for receiving signals on the upper surface of the first circuit board 301.

In some embodiments, when both the second flexible circuit board 602 and the third flexible circuit board 603 are connected to the lower surface of the first circuit board 301, both the golden fingers for transmitting signals and the golden fingers for receiving signals are arranged on the lower surface of the first circuit board 301. Exemplarily, first high-speed signal pads run through the lower surface of the first circuit board 301, and establish an electrical connection with the golden fingers for transmitting signals on the lower surface of the first circuit board 301; second high-speed signal pads run through the lower surface of the first circuit board 301, and establish an electrical connection with the golden fingers for receiving signals on the lower surface of the first circuit board 301.

The number of electrical components arranged in the light emitting component 500 is relatively large, and the number of signal lines connected to the outside of the light emitting component 500 is more than that of the light receiving component 400; thus, two layers of flexible circuit boards are used to connect with the circuit boards, while the light receiving component 400 may be connected to the circuit board with one layer of flexible circuit board.

Considering the above wiring design requirements and an overall space utilization of the optical module, the first circuit board 301 and the second circuit board 302 are arranged in a stacked way, as shown in FIG. 8, with the first circuit board 301 being arranged below the second circuit board 302; the light receiving component 400 and the light emitting component 500 are arranged in a stacked way, as shown in FIG. 8, with the light receiving component 400 being provided below the light emitting component 500.

The upper surface of the first circuit board 301 and the upper surface of the second circuit board 302 are respectively used for connecting to the light emitting component 500, and the lower surface of the first circuit board 301 is used for connecting with the light receiving component 400.

First high-speed signal pads are provided on one end of the upper surface of the first circuit board 301; one end of the second flexible circuit board 602 is connected to the first high-speed signal pads, and the other end thereof is connected to the lower surface of the pin connector 501 of the light emitting component 500.

Second high-speed signal pads are provided on one end of the lower surface of the first circuit board 301; one end of the third flexible circuit board 603 is connected to the second high-speed signal pads, and the other end thereof is connected to the inside of the light receiving component 400.

Since the light emitting component 500 has a higher requirement for air tightness than that the light receiving component 400, the flexible circuit board may directly extend into the light receiving component 400.

Non-high-speed signal pads are provided on the upper surface of the second circuit board 302; one end of the first flexible circuit board 601 is connected with the non-high-speed signal pads, and the other end thereof is connected with the upper surface of the pin connector 501 of the light emitting component 500; in some embodiments of the present disclosure, non-high-speed signal pads are disposed on the lower surface of the second circuit board 302, and one end of the first flexible circuit board 601 may also be connected to the lower surface of the second circuit board 302.

The second circuit board 302 is arranged above the first circuit board 301, and the first circuit board 301 and the second circuit board 302 are arranged in a stacked way; by this, it is possible to take advantages of a space in the height direction within the optical module to increase an area for tracing layout. The light receiving component 400 is arranged below the emitting component 500, the stacked arrangement of the light emitting component 500 and the light receiving component 400 take advantages of a space in the height direction within the optical module to increase a volume for layout of devices. A high-speed signal electrical connection from the first circuit board 301 to the emitting component 500 is realized by the second flexible circuit board 602, and a high-speed signal electrical connection from the first circuit board 301 to the light receiving component 400 is realized by the third flexible circuit board 603. In a possible implementation, a high-speed signal path can be established directly through the golden fingers on the first flexible circuit board 601, which reduces a transfer of high-speed signals and facilitates low-loss transmission of high-speed signals. The establishment of non-high-speed signal electrical connection from the second circuit board 302 to the light emitting component 500 is enabled via the first flexible circuit board 601.

In some embodiments, the high-speed signals and the non-high-speed signals generated by the light receiving component 400 are transmitted sequentially through the third flexible circuit board 603 and the first circuit board 301, and the high-speed signals and the non-high-speed signals generated by the light receiving component 400 are both transmitted to the host computer; by this, an optimal transmission path for electrical signals is realized, a loss of electrical signals during transmission is reduced, and a low-loss transmission of electrical signals is realized.

In some embodiments, high-speed signals required by the light emitting component 500 are transmitted to the light emitting component 500 through the first circuit board 301 and the second flexible circuit board 602 sequentially. In some embodiments, non-high-speed signals required by the light emitting component 500 are transmitted to the light emitting component 500 through the first circuit board 301, the second circuit board 302, and the first flexible circuit board 601 sequentially. The optical module provided by the present disclosure can be provided with different flexible circuit boards for different signal types, which can reduce intertwining of signal tracings and cross talking between signals, thereby optimizing the signal transmission path, while reducing the loss of high-speed signals during transmission and ensuring the transmission performance of high-speed signals.

In some embodiments, the second flexible circuit board 602 can also be used for transmitting non-high-speed signals required by the light emitting component 500. Exemplarily, non-high-speed signals required by the light emitting component 500 may also be transmitted to the light emitting component 500 through the first circuit board 301 and the second flexible circuit board 602 sequentially.

It is noted that the first flexible circuit board 601 is used for only transmitting non-high-speed signals required by the light emitting component 500, but not for transmitting high-speed signals required by the light emitting component 500; meanwhile, the second flexible circuit board 602 can be used for transmitting both non-high-speed signals required by the light emitting component 500 and high-speed signals required by the light emitting component 500.

Figure 10:
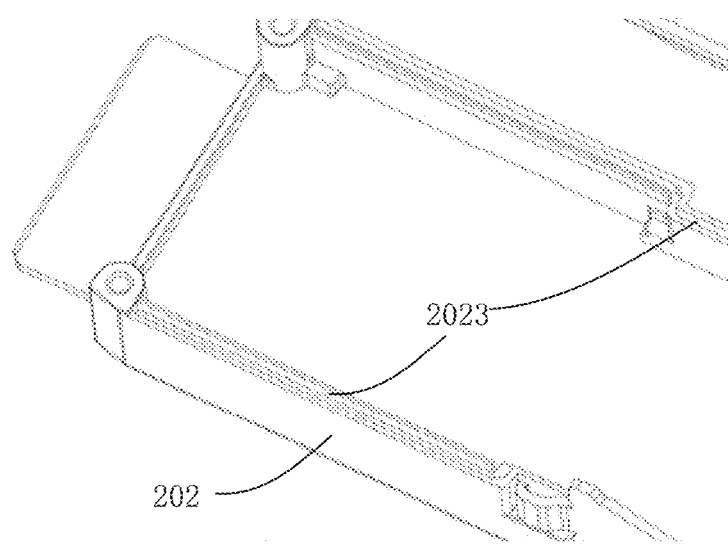
FIG. 10 is a schematic diagram of a local structure of a lower housing of an optical module according to some embodiments of the present disclosure.

FIG. 10 is a schematic diagram of a partial structure of a lower housing of an optical module provided according to some embodiments of the present disclosure. As shown in FIG. 10, a groove 2023 is formed on the edge side plate of the lower housing 202 of the optical module. The edge side plate of the lower housing 202 is folded with respect to the main board (i.e., bottom plate) of the lower housing 202 towards the upper housing 201, and joins with the upper housing 201 to form the side wall of the entire optical module. The unlocking part 203 of the optical module is fitted on the outside of the edge side plate. The surface of the edge side plate facing towards the upper housing is recessed to form a groove 2023. The outline of the edge side plate can be a straight line or a curved line.

Figure 11:
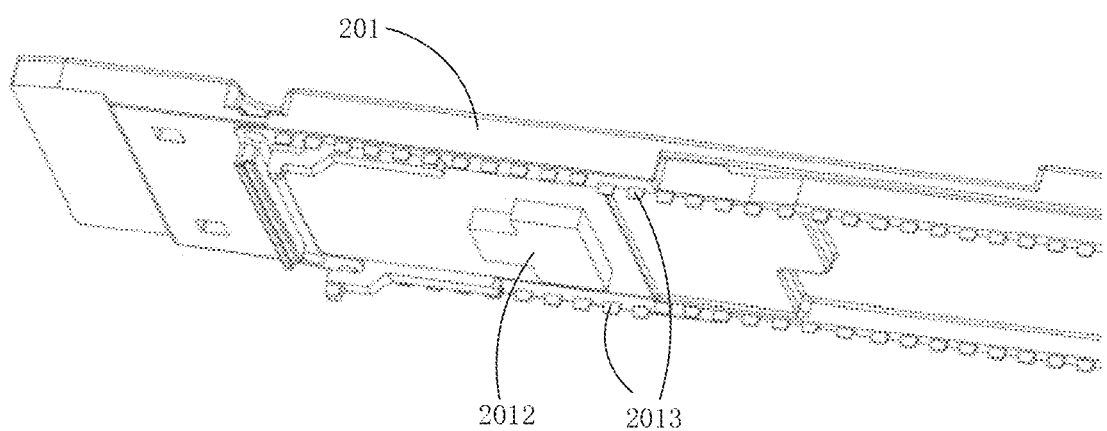
FIG. 11 is a schematic diagram of a local structure of an upper housing of an optical module according to some embodiments of the present disclosure.

FIG. 11 is a schematic diagram of a partial structure of an upper housing of an optical module according to some embodiments of the present disclosure. As shown in FIG. 11, a heat conduction block 2012 is disposed on a bottom surface of the upper housing 201, and in some embodiments, the heat conduction block is also referred to as a heat dissipation block. Protrusions 2013 are provided on the edge side wall of the upper housing 201; when the edge side wall of the upper housing 201 is engaged with the edge side plate of the lower housing, the protrusions 2013 of the upper housing 201 are inserted into the groove 2023 of the lower housing.

Figure 12:
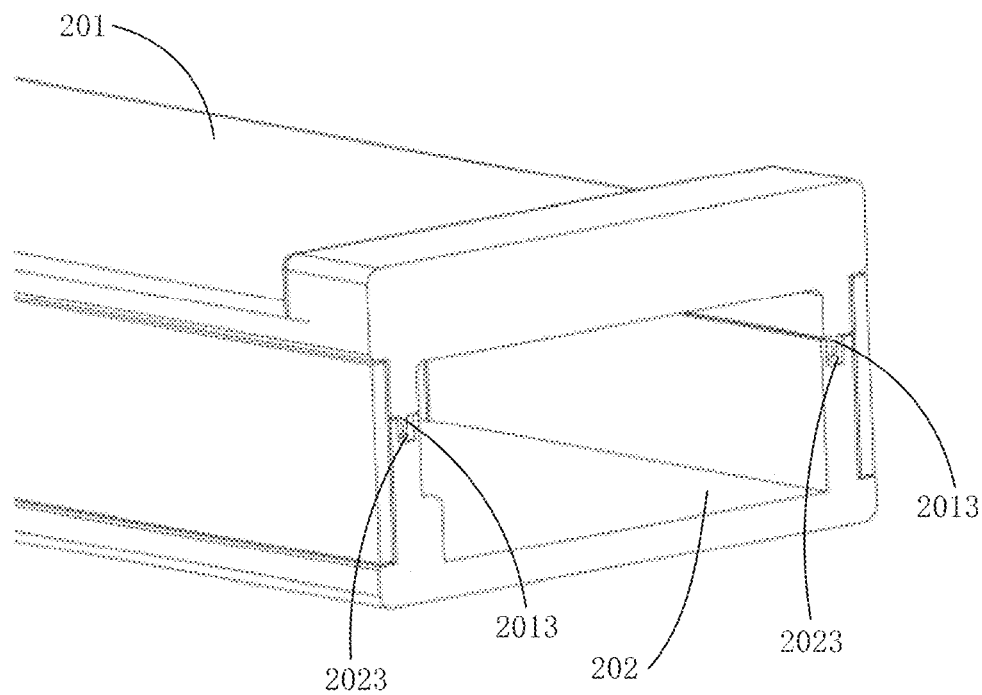
FIG. 12 is a schematic cross-sectional view of a housing of an optical module housing provided according to some embodiments of the present disclosure.

FIG. 12 is a schematic cross-sectional view of an optical module housing provided according to some embodiments of the present disclosure. As shown in FIG. 12, the cross-sectional view is taken in a state where the upper housing 201 and the lower housing 202 are engaged together, in which the edge side wall of the upper housing 201 abuts against the edge side plate of the lower housing 202, and the protrusions 2013 on the edge side wall of the upper housing 201 are inserted into the groove 2023 of the edge side plate of the lower housing 202.

The upper housing 201 and the lower housing 202 of the optical module are engaged together to form an enclosing cavity which has a function of electromagnetic shielding. The enclosing cavity is formed by an abutment of the edge side wall of the upper housing 201 against the edge side plate of the lower housing 202. An abutment engagement as such often leads to gaps between two planes; electromagnetic waves may pass through the gaps so that requirements for electromagnetic shielding may not be satisfied. The gap may be shut/closed by an engagement/cooperation of the protrusion into the groove.

As shown in FIG. 11, the protrusions 2013 include a plurality of protrusions 2013 spaced apart from each other. Although there exist spacings between respective protrusions 2013, electromagnetic waves may still be favorably shielded/blocked.

Figure 13:
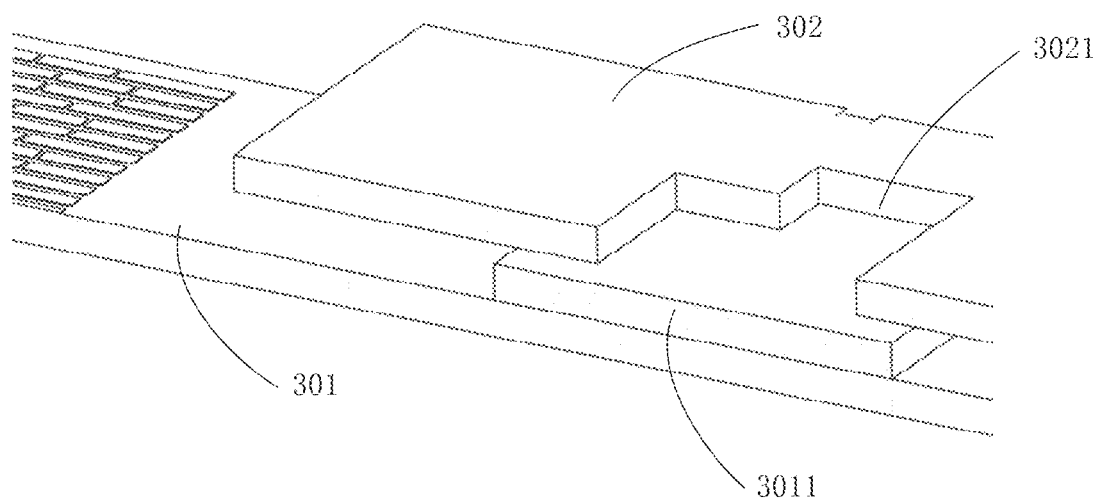
FIG. 13 is a sectional view of a local structure of a circuit board according to some embodiments of the present disclosure.

FIG. 13 is a sectional view of a partial structure of a circuit board provided according to some embodiments of the present disclosure. As shown in FIG. 13, a chip 3011 is disposed between the first circuit board 301 and the second circuit board 302, and the chip 3011 is arranged on the surface of the first circuit board 301. In order to dissipate heat from the chip 3011, a through hole 3021 is formed on the second circuit board 302, through which the heat conduction block 2012 on the bottom surface of the upper housing in FIG. 11 may be in direct thermal contact with the chip 3011, so as to dissipate heat via the heat conduction block 2012 and the upper housing 201.

The thermal contact can be direct thermal contact, or can be an indirect thermal contact that can be achieved by providing a heat conduction cushion between the chip 3011 and the heat conduction block 2012; the cushion can act as a soft buffer to protect the chip 3011.

It should be noted that in this specification, the term "comprising", "including" or any other variation thereof is intended to encompass a non-exclusive inclusion, so that a circuit structure, article or device including a series of elements includes not only those elements, and also includes other elements not expressly listed, or elements inherent in the circuit structure, article, or device. Without further limitations, the presence of an element qualified by the phrase "comprising a . . . " does not exclude the presence of additional identical elements in the circuit structure, article or device comprising the element.

Other embodiments of the present disclosure will be readily apparent to those skilled in the art upon consideration of the specification and practice of the inventive disclosure herein. The present disclosure is intended to encompass any modification, use or adaptation of the present disclosure. These modifications, uses or adaptations follow the general principles of the present disclosure and include common knowledge or conventional technical means in the technical field not disclosed in the present disclosure. The specification and examples are to be considered exemplary only, with the true scope and spirit of the disclosure indicated by the appended claims.

The above embodiments of the present disclosure do not limit the protection scope of the present disclosure.

What is claimed is:

1. An optical module, comprising:
   a first circuit board, wherein golden fingers are provided on surfaces at one end of the first circuit board, a first high-speed signal pad is provided on an upper surface at the other end of the first circuit board, and a second high-speed signal pad is provided on a lower surface at said other end of the first circuit board;
   a second circuit board, which is arranged above the first circuit board and is electrically connected to the first circuit board, with a non-high-speed signal pad being provided on a surface of the second circuit board;
   a light emitting component, which is arranged above the first circuit board and electrically connected to a first flexible circuit board and a second flexible circuit board respectively, and a tip of the light emitting component is provided with a pin connector;
   a light receiving component, wherein the light receiving component and the light emitting component are arranged in a stacked way, one above the other, with the light receiving component being arranged below the light emitting component and being electrically connected to a third flexible circuit board;
   the first flexible circuit board electrically connected to an upper surface of the pin connector, with one end of the first flexible circuit board being electrically connected to the light emitting component, and the other end of the first flexible circuit board being electrically connected to the non-high-speed signal pad;
   the second flexible circuit board electrically connected to a lower surface of the pin connector, with one end of the second flexible circuit board being electrically connected to the light emitting component, and the other end of the second flexible circuit board being electrically connected to the first high-speed signal pad; and
   the third flexible circuit board, with one end of the third flexible circuit board being electrically connected to the light receiving component, and the other end of the third flexible circuit board being electrically connected to the second high-speed signal pad.

2. The optical module according to claim 1, wherein the first high-speed signal pad runs through the upper surface of the first circuit board and is electrically connected to the golden fingers provided on the upper surface of the first circuit board; the second high-speed signal pad runs through the lower surface of the first circuit board and is electrically connected to the golden fingers provided on the lower surface of the first circuit board.

3. The optical module according to claim 1, further comprising an upper housing, wherein a heat conduction block is disposed on a bottom surface of the upper housing facing towards the second circuit board; wherein the second circuit board is provided with a through hole, and a chip is disposed on the surface of the first circuit board facing towards the second circuit board, such that a surface of the chip may be in thermal contact with the heat conducting block via the through hole.

4. The optical module according to claim 1, further comprising an upper housing and a lower housing, wherein protrusions are provided on edge side walls of the upper housing, and a groove is formed on edge side walls of the lower housing, with the protrusions being inserted into the groove.

5. The optical module according to claim 4, wherein the protrusions are a plurality of protrusions spaced apart from each other.

6. The optical module according to claim 1, wherein an opening is provided at a tip of the light receiving component, and the third flexible circuit board extends into the light receiving component through the opening, so as to realize an electrical connection between an inside and an outside of the light receiving component.

7. The optical module according to claim 1, wherein the first circuit board and the second circuit board are connected via a pin type electrical connector or a plug type electrical connector.

8. An optical module, comprising:
   a first circuit board, wherein golden fingers are provided on surfaces at one end of the first circuit board, and a first high-speed signal pad and a second high-speed signal pad are respectively provided on surfaces at the other end of the first circuit board;
   a second circuit board, which is arranged above the first circuit board and is electrically connected to the first circuit board, with a non-high-speed signal pad being provided on a surface of the second circuit board;
   a light emitting component, which is arranged above the first circuit board and electrically connected to a first flexible circuit board and a second flexible circuit board respectively;
   a light receiving component, wherein the light receiving component and the light emitting component are arranged in a stacked way, one above the other, with the light receiving component being arranged below the light emitting component and being electrically connected to a third flexible circuit board;
   the first flexible circuit board, wherein one end of the first flexible circuit board is electrically connected to the light emitting component, and the other end of the first flexible circuit board is electrically connected to the non-high-speed signal pad;
   the second flexible circuit board, wherein one end of the second flexible circuit board is electrically connected to the light emitting component, and the other end of the second flexible circuit board is electrically connected to the first high-speed signal pad; and
   the third flexible circuit board, wherein one end of the third flexible circuit board is electrically connected to the light receiving component, and the other end of the third flexible circuit board is electrically connected to the second high-speed signal pad.

9. The optical module according to claim 8, wherein the first high-speed signal pad is arranged on an upper surface at said other end of the first circuit board, and the second high-speed signal pad is arranged on a lower surface at said other end of the first circuit board.

10. The optical module according to claim 9, wherein the golden fingers comprise golden fingers for transmitting signals and golden fingers for receiving signals;
   wherein the first high-speed signal pad runs through the upper surface of the first circuit board, and establishes an electrical connection with the golden fingers for transmitting signals on the upper surface of the first circuit board; the second high-speed signal pad runs through the lower surface of the first circuit board, and establishes an electrical connection with the golden fingers for receiving signals on the lower surface of the first circuit board.

11. The optical module according to claim 8, wherein the first high-speed signal pad and the second high-speed signal pad are both arranged on an upper surface at the other end of the first circuit board.

12. The optical module according to claim 11, wherein the golden fingers comprise golden fingers for transmitting signals and golden fingers for receiving signals;
wherein the first high-speed signal pad runs through the upper surface of the first circuit board, and establishes an electrical connection with the golden fingers for transmitting signals on the upper surface of the first circuit board; the second high-speed signal pad runs through the upper surface of the first circuit board, and establishes an electrical connection with the golden fingers for receiving signals on the upper surface of the first circuit board.

13. The optical module according to claim 8, wherein the first high-speed signal pad and the second high-speed signal pad are both arranged on a lower surface at the other end of the first circuit board.

14. The optical module according to claim 13, wherein the golden fingers comprise golden fingers for transmitting signals and golden fingers for receiving signals;
wherein the first high-speed signal pad runs through the lower surface of the first circuit board, and establishes an electrical connection with the golden fingers for transmitting signals on the lower surface of the first circuit board; the second high-speed signal pad runs through the lower surface of the first circuit board, and establishes an electrical connection with the golden fingers for receiving signals on the lower surface of the first circuit board.

15. The optical module according to claim 8, wherein a first pin connector is provided at a tip of the light emitting component; wherein the first flexible circuit board is electrically connected to an upper surface of the first pin connector, and the second flexible circuit board is electrically connected to a lower surface of the first pin connector;
a second pin connector is provided at a tip of the light emitting component; wherein the second flexible circuit board is electrically connected to the second pin connector to realize an electrical connection between an inside and an outside of the light receiving component.

16. The optical module according to claim 8, wherein an opening is provided at a tip of the light receiving component, and the third flexible circuit board extends into the light receiving component through the opening, so as to realize an electrical connection between an inside and an outside of the light receiving component.

17. An optical module, comprising:
a first circuit board, wherein golden fingers are provided on surfaces at one end of the first circuit board, and a first high-speed signal pad and a second high-speed signal pad are respectively provided on surfaces at the other end of the first circuit board;
a second circuit board, which is arranged above the first circuit board and is electrically connected to the first circuit board, with a non-high-speed signal pad being provided on a surface of the second circuit board;
a light emitting component, which is arranged above the first circuit board and electrically connected to a first flexible circuit board and a second flexible circuit board respectively;
a light receiving component, wherein the light receiving component and the light emitting component are arranged in a stacked way, one above the other, with the light receiving component being arranged below the light emitting component and being electrically connected to a third flexible circuit board;
the first flexible circuit board, wherein one end of the first flexible circuit board is electrically connected to the light emitting component, and the other end of the first flexible circuit board is electrically connected to the non-high-speed signal pad;
the second flexible circuit board, wherein one end of the second flexible circuit board is electrically connected to the light emitting component, and the other end of the second flexible circuit board is electrically connected to the first high-speed signal pad; and
the third flexible circuit board, wherein one end of the third flexible circuit board is electrically connected to the light receiving component, and the other end of the third flexible circuit board is electrically connected to the second high-speed signal pad;
an upper housing, wherein protrusions are provided on edge side walls of the upper housing, wherein the protrusions are a plurality of protrusions that are spaced apart from each other;
a lower housing, wherein a groove is provided on edge side wall of the lower housing, wherein the protrusions are inserted into the groove.

18. The optical module according to claim 17, wherein the first high-speed signal pad is arranged on an upper surface at the other end of the first circuit board, and the second high-speed signal pad is arranged on a lower surface at the other end of the first circuit board; or
the first high-speed signal pad and the second high-speed signal pad are both arranged on the upper surface at the other end of the first circuit board; or
the first high-speed signal pad and the second high-speed signal pad are both arranged on the lower surface at the other end of the first circuit board.

19. The optical module according to claim 17, wherein a first pin connector is provided at a tip of the light emitting component; wherein the first flexible circuit board is electrically connected to an upper surface of the first pin connector, and the second flexible circuit board is electrically connected to a lower surface of the first pin connector;
a second pin connector is provided at a tip of the light emitting component; wherein the second flexible circuit board is electrically connected to the second pin connector to realize an electrical connection between an inside and an outside of the light receiving component; or
an opening is provided at the tip of the light receiving component, wherein the third flexible circuit board extends into the light receiving component through the opening, so as to realize an electrical connection between an inside and an outside of the light receiving component.

20. The optical module according to claim 17, wherein a heat conduction block is disposed on a bottom surface of the upper housing facing towards the second circuit board; wherein the second circuit board is provided with a through hole, and a chip is disposed on the surface of the first circuit board facing towards the second circuit board, such that a surface of the chip may be in thermal contact with the heat conducting block via the through hole.

* * * * *